(12) United States Patent
Birurakis

(10) Patent No.: US 10,948,536 B2
(45) Date of Patent: Mar. 16, 2021

(54) SYSTEM FOR ENHANCING ATE FAULT ISOLATION CAPABILITY USING A TRUTH TABLE BASED ON A FAILURE ISOLATION MATRIX

(71) Applicant: William I. Birurakis, Great Mills, MD (US)

(72) Inventor: William I. Birurakis, Great Mills, MD (US)

(73) Assignee: Pioneering Decisive Solutions, Inc., California, MD (US)

( * ) Notice: Subject to any disclaimer, the term of this patent is extended or adjusted under 35 U.S.C. 154(b) by 424 days.

(21) Appl. No.: 15/919,999

(22) Filed: Mar. 13, 2018

(65) Prior Publication Data

US 2019/0285693 A1 Sep. 19, 2019

(51) Int. Cl.
*G01R 31/28* (2006.01)
(52) U.S. Cl.
CPC ................. *G01R 31/2834* (2013.01)
(58) Field of Classification Search
CPC .................................. G01R 31/2834
See application file for complete search history.

(56) References Cited

U.S. PATENT DOCUMENTS

| | | | |
|---|---|---|---|
| 6,246,743 B1* | 6/2001 | Kopp, III | A61B 6/032 378/19 |
| 8,103,225 B2* | 1/2012 | Couchman | H03F 1/0205 455/127.1 |
| 9,739,827 B1* | 8/2017 | Spinner | G01R 31/2834 |

* cited by examiner

*Primary Examiner* — Elias Desta
(74) *Attorney, Agent, or Firm* — Clark A. Puntigam; Jensen & Puntigam, P.S.

(57) ABSTRACT

The invention is a truth table-based failure isolation matrix in an Automated Test Equipment (ATE) environment to enable the mapping of measured results and/or test outcomes to probable causes of failure (PCOF). The failure isolation matrix is hierarchical in that it applies to both individual tests as well as groups of tests. For each level in the hierarchy, columns represent individual outcomes verified against expected results to produce a resultant outcome and rows represent possible combinations of measurement outcomes or outcome vectors. For groups of tests, the measurement results represent the combined results of the individual tests within the test group. The resultant matrix is a pattern of vectors that can be pattern matched against prior history of result patterns to further improve the accuracy and narrow the scope of PCOF.

25 Claims, 7 Drawing Sheets

| | 710 | | 720 | 730 |
|---|---|---|---|---|
| Meas1 | Meas2 | Meas3 | Test Outcome | Test Callout |
| X | X | P | Pass | No Fault |
| X | P | F | Fault1 | Component1 |
| P | F | F | Fault2 | Component2 |
| F | F | F | Fault3 | Component3 |

| | Meas1 | Meas2 | Meas3 | Test Outcome | Callout |
|---|---|---|---|---|---|
| | X | X | P | Passed | |
| | X | P | F | Fault1 | Component1 |
| | P | F | F | Fault2 | Component2 |
| | F | F | F | Fault3 | Component3 |

If no rules match then the Test Outcome will be "Failed"

Legend
P - Passed
F - Failed
H - Failed High
L - Failed Low
X - Don't Care
T - Timed Out
N - No Measurement ▼ Outcomes Outcome Value
Passed
Failed
Fault1
Fault2
Fault3

FIG. 10

SYSTEM FOR ENHANCING ATE FAULT ISOLATION CAPABILITY USING A TRUTH TABLE BASED ON A FAILURE ISOLATION MATRIX

RELATED APPLICATIONS

The following applications are related to the present application: U.S. patent application Ser. No. 15/081,083, filed on Mar. 24, 2016, now U.S. Pat. No. 9,989,589Jitle: Computer System for Automatic Test Equipment (ATE) Using One or More Dedicated Processing Cores for ATE functions; U.S. patent application Ser. No. 15/335,148, filed on Oct. 26, 2016, now U.S. Pat. No. 10,288,679, title: System and Method for Improving Temporal Visualization of Signal Relationships in a Coherent Time-Domain ATE Test Execution Environment; U.S. patent application Ser. No. 15/449,759, filed on Mar. 3, 2017, now U.S. Pat. No. 10,649,024, title: System for Providing ATE Test Programming by Utilizing Drag and Drop Workflow Editing in a Time Domain Environment.

TECHNICAL FIELD

The present invention relates to the field of Automated Test Equipment (ATE) systems and, more particularly to a system for isolating probable cause of failure (PCOF) information for a unit under test (UUT) based on test outcomes using a user-configurable test group failure isolation matrix truth table.

BACKGROUND OF THE INVENTION

ATE test programs are often organized into tests and test groups to provide logical groupings of testing procedures. A test program generally contains one or more test groups, and test groups contain one or more tests. This hierarchy allows test program development and debugging to be divided into common functionality, or divided into sections for testing different UUT subsystems. Those skilled in the art are familiar with the common organizational structures of ATE test programs.

In prior art ATE systems, tests usually involve the measurement of a discrete characteristic of a signal or acquisition, followed by comparison of that characteristic with a set of limits or values; subsequent tests acquire additional signal characteristic, as a test program is executed. The comparison process that occurs for each acquisition produces a result. That result may further be used to determine how the outcome of the test should be reported.

In prior art ATE systems, test programs execute tests in a sequential progression performing what is commonly referred to as detection tests until either all of these tests pass or until the first failure occurs. If a failure occurs, a diagnostic branch of the test program may be invoked to narrow down the Probable Cause of Failure (PCOF) through a process known as fault isolation. A disadvantage to this approach is that there may be several primary faults, those that would be identified during the detection phase of the test program. However, only the first occurring fault will be identified during any given test program execution. To identify and narrow down the PCOF for all faults may require repeated execution of the test program, a very time consuming and tedious process.

Hence, there is a need to improve ATE test executive outcome and PCOF (Probable Cause of Failure) determination to more easily accommodate creation of complex deterministic criteria, especially to more easily enable the usage of multiple criteria for outcome definition.

The present invention describes a system and method to improve the isolation of PCOF at both the test and test group level. The invention improves upon the existing fault isolation and fault detection mechanisms of traditional ATE test executives by allowing both the ability to find all faults within a UUT and the ability to isolate each fault down to a PCOF. Failure isolation matrices are applied to criteria at the end of a test and/or test group, and have beneficial applicability to sequential tests, parallel tests, and time-coherent parallel tests.

Accordingly, it is an objective of the present invention to enhance the fault detection and isolation capabilities of an ATE test executive. It is another objective to provide a method that will facilitate the creation of complex deterministic criteria using signal measurement outcomes and/or test outcomes to produce test and/or test group outcomes and isolate PCOFs.

SUMMARY OF THE INVENTION

Accordingly, the present invention in one embodiment includes a default isolation matrix based system for an ATE, comprising: a test sequence comprising a plurality of individual ATE tests, defining a test group for a unit under test, wherein each test results in an outcome as the test sequence progresses; an outcome determination vector indicating a pass indication for the test group if all tests pass and a failure indication or if any one of the individual tests in the test group fails; wherein the individual test failures form a matrix pattern of sets of test failures; and a test group callout or decision corresponding to the outcome vector or vectors indicating a user configured value representing a group of components in the unit under test associated with a particular set of test failures in the matrix pattern.

In another embodiment, the invention includes a default isolation matrix based test method used with an ATE, comprising the steps of: carrying out a test sequence comprising a plurality of individual ATE tests, defining a test group for a unit under test, wherein each test results in an outcome as the test sequence progresses; producing an outcome determination vector indicating a pass indication for the test group if all tests pass and a failure indication or if any one of the individual tests in the test group fails; wherein the individual test failures form a matrix pattern of sets of test failures; and producing a test group callout or decision corresponding to the outcome vector or vectors indicating a user configured value representing a group of components in the unit under test associated with a particular set of test failures in the matrix pattern.

BRIEF DESCRIPTION OF THE DRAWINGS

FIG. 10 represents a screen capture of the callout that gets displayed at the end of the TPS execution that shows the stacking of callout information from test level and test group level on different pages of the callout display dialog.

DETAILED DESCRIPTION OF THE PREFERRED EMBODIMENT

Figures 1, 2:
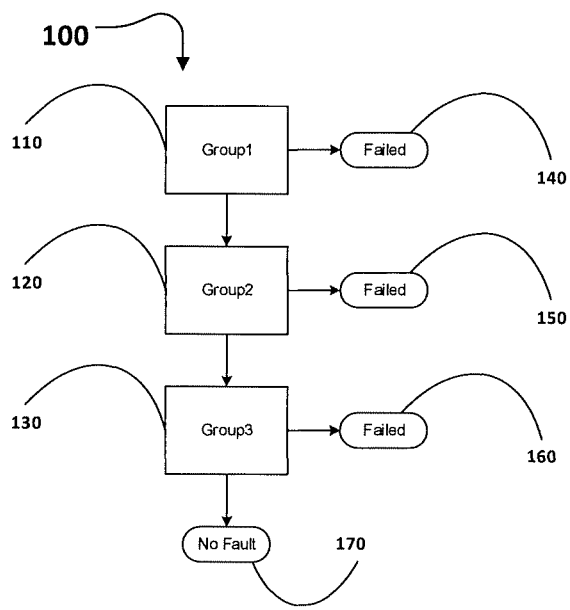
FIG. 1 is a prior art exemplary depiction of the logic flow of a test program fault tree.
FIG. 2 is a prior art exemplary depiction of a test program fault tree using a table representation.

This invention combines the fault detection and fault isolation techniques used in traditional ATE test executives to create an improved method of PCOF isolation based on a truth table matrix that facilitates the detection of faults at multiple levels and the fault isolation as a result of a combination of multiple measurement outcomes all performed in one single test. As a result of this method, the accuracy of PCOF isolation is highly improved, doubled by a significant reduction of the test execution time. Additionally, through the use of pattern matching, a TPS result matrix can be pattern matched against previous result matrices with known root-cause fault identification to further narrow the accuracy and scope for repair/replacement.

Illustrative embodiments of the invention are described below. For clarity of understanding of the invention, complete details of an actual implementation are not presented in this description. It will of course be recognized that in any such actual embodiment, application-specific conclusions based on developer specific goals such as those pertaining to system-related constructs and constraints, may vary from one implementation to another. While such a development effort might be time-consuming, it would nevertheless be a routine undertaking for those of skill in the art having the benefit of this disclosure. The following comprises a glossary of nomenclature used herein:

ATE Execution Engine—The specific component or capability of an ATE Test Executive that executes predefined test programs.

Automated Test Equipment (ATE)—an apparatus that performs tests on a device using automation to quickly perform stimuli and acquisitions and evaluate the results of said stimuli and acquisitions. The use of ATE includes reference to Automated Test System (ATS) and other names for like systems that perform similar testing processes.

ATE Test Executive—software that operates as the overall manager of component systems in an ATE. More specifically, the test executive enables the creation and configuration of test programs as well as controls the execution of said test programs.

Callout—a message listing the possible faulty components and, optionally an image of the UUT highlighting the location of the faulty components on the UUT Diagnostics—Tests executed after a test failure to further isolate the fault to PCOF.

Fault—an abnormal condition or defect at the component or sub-system level, which may lead to a failure.

Fault Detection—An execution mode of a test program where the test program executes test groups until a single failure occurs or until all tests pass successfully.

Fault Isolation—An execution mode of a test program where the test program executes diagnostic specific test groups and tests, after a Fault Detection has been identified, to narrow the ambiguity group of components the caused the failure.

Fault Tree—a diagram providing the fault isolation behavior (branching or callout) at test group and test program level Instrument Operation—The logical instrument action, which may be a combination of physical instrument actions. That is, an operation may describe multiple actions which are performed together to accomplish a task.

Outcome Vector—A unique combination of measurement outcomes that identifies a test outcome and a PCOF PCOF—Probable cause of failure. A list of one or more discrete faults.

Temporally Coherent—Deterministic within the time domain.

Test Group—A test group consists of one or more test sequences.

Test Outcome—A possible result of a test; the most common results are Passed and Failed Test Program—A set or collection of test groups.

Test Sequence—A series of operations that the user specifies for execution.

Truth Table—A table used to formulate the logical truth or falsity of a plurality of test and/or test group outcomes based on the outcome of each individual component of said test and/or test group.

Unit Under Test (UUT)—A device or component that is being tested such as a circuit card or assembly of electronic components. Sometimes also referred to as Device Under Test (DUT) or Equipment Under Test (EUT).

The word "exemplary" is used herein to mean "serving as an example, instance, or illustration." Any embodiment described herein as "exemplary" is not necessarily to be construed as preferred or advantageous over other embodiments. Those of skill in the art will recognize other embodiments may be utilized, and other changes may be made, without departing from the spirit or scope of the subject matter presented herein. Furthermore, the claimed subject matter may be implemented as a method, system, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any non-transitory computer-readable device, or media.

The illustrative embodiments described in the detailed description, drawings, and claims are not meant to be limiting. Other embodiments may be utilized, and other changes may be made, without departing from the spirit or scope of the subject matter presented here.

Embodiments of the present invention generally provide for an enhanced fault isolation capability for ATE test programs.

In order to understand the principle of the invention and improvement offered by the invention, it is important to become familiar with aspects of prior art ATE test program execution which will now be described.

With reference to FIG. 1, a flowchart of an exemplary prior art test program execution fault tree 100 is depicted; each test 110, 120, and 130 is executed in sequence. However, if any given test fails, the flow of the test program is altered and subsequent tests are not executed. For example, if Test 1000 110 fails, then the test program follows a Failed 140 branch which may perform diagnostics or other procedures. In this case, Test 1010 120 and Test 1020 130 are never executed. Likewise, if Test 1000 110 is successful but Test 1010 120 fails, the test program follows a Failed 150 branch. Similarly, if Test 1000 110 and Test 1010 120 are successful and Test 1020 130 fails, the test program follows a Failed 160 branch. Only if all tests 110, 120 and 130 are successful do we reach the No Fault 170 conclusion.

In this paradigm, we can isolate a specific fault should one of the executed tests (110, 120, and 130) fail. However, we cannot determine all possible faults (140, 150, and 160) that can occur across test program execution because once a test fails the remaining tests defined in the test program sequence will not be executed.

FIG. 2 is an exemplary prior art table representation 200 associated with the flowchart 100. Each test 210 is represented by a row in the table. Based on the test outcome 220, the next step in the test program 230 is determined as is the test program outcome 240 and test program callout or result 250. Applying a specific exemplary example from the FIG. 1 discussion above, we can easily relate these two figures. When the Test 1000 210 passes 220, the next step in the test program 230 that will be executed is Test 1010. If Test 1010 210 fails, the test program outcome 240 is set to Fail and the test program callout 250 is set to "card 2", the location of the fault in the unit under test.

The following description will relate to the distinguishing embodiments and features of the present invention.

Figures 3, 4:
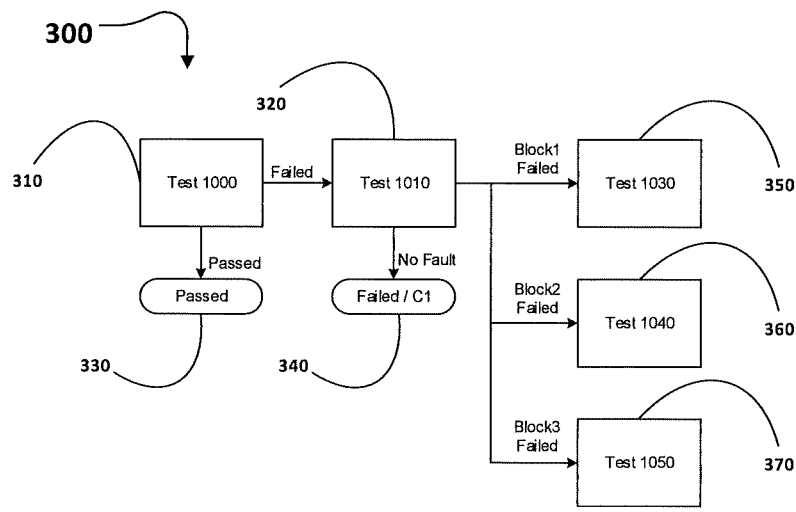
FIG. 3 illustrates the logic used by the Test Executive Engine in identifying the test group outcome(s) and the test group callout(s) as a result of executing all test within that test group
FIG. 4 is an exemplary depiction of a test group failure isolation matrix using a truth-table representation.

FIG. 3 represents an exemplary test group functional tree flowchart 300. In the described invention the test program is defined as a sequence of test groups, where each test group is defined as a sequence of tests. Each test 310, 320, 330 and 330 is executed in a sequence regardless of the outcome of any one of those tests. The execution engine records the actual test outcomes and uses them at the end of the test group execution to determine a test group outcome vector, and then matches the vector against all possible entries/outcomes as they have been defined in the truth table-based outcome matrix 350 to identify the one test group outcome associated with the actual measurements and the corresponding callout/result 360.

According to the invention, a truth table-based failure isolation matrix, as shown in the illustrated embodiment 400, is applied for all test results within a test group. Each test in the test group 410 is represented by a column in the table 400. In the illustrated embodiment there are four (4) tests shown: Test 1000, Test 1010, Test 1020, and Test 1030. Each row represents a test group outcome vector of a pattern of test outcomes, or a user-defined combination of test outcomes, and the corresponding test group outcome 420 and callout 430 for that outcome vector. Using the second row of the table 400 as a specific example where Test 1000 is marked as Pass, Test 1010 is marked as Fault1, Test 1020 is marked as Pass, and Test 1030 is marked as Pass; the test group outcome 420 is identified as "Fail" due to Test 1010 having not completed successfully and the callout 430 is "C1". The identifier or value in the callout 430, e.g. C1, is a user defined arbitrary value representing a meaningful identifier to the user which indicates the smallest ambiguity group of components that caused the test group 410 to have the failed outcome 420. The matrix table as depicted in the embodiment 400 contains all valid possible combinations of Pass, Fail, Fault, or other possible status for the combination of tests in the test group 410. In this exemplary depiction, there are seven (7) possible different combinations of pass/fail across the four (4) tests in the test group 410. A different number of tests will result in a different total number of possible pass/fail combinations. After the test group finishes execution only one of these test group outcome vectors will match the actual test results. Thus, the test group outcome 420 and callout 430 are uniquely identified for the vector, identifying the location of the fault.

Figure 5:
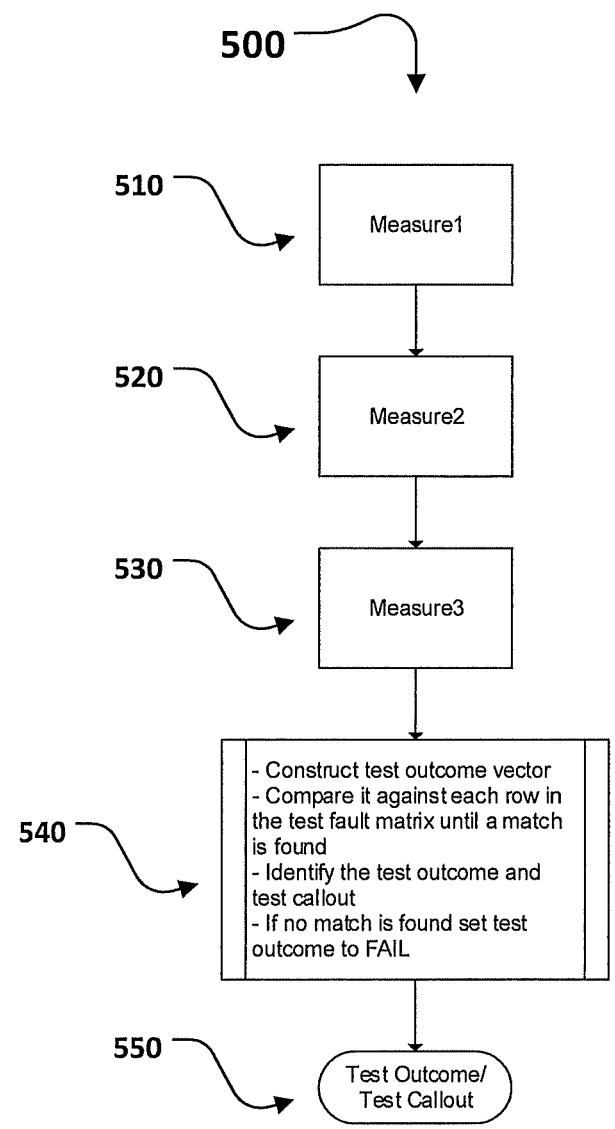
FIG. 5 illustrates the logic used in running a sequential test in identifying the test outcome(s) and the test callout(s) as a result of performing all signal measurements within that test.

FIG. 5 represents an exemplary test 500 that performs three measurements 510, 520 and 530 in a sequential order. Each measurement is compared against limits and the result of this comparison is recorded by the execution engine to build a test outcome vector 540. At the end of the test execution this test outcome vector is matched against existing vectors as they are defined in the truth table-based fault isolation matrix and the corresponding test outcome and callout 550 are identified.

Figure 6:
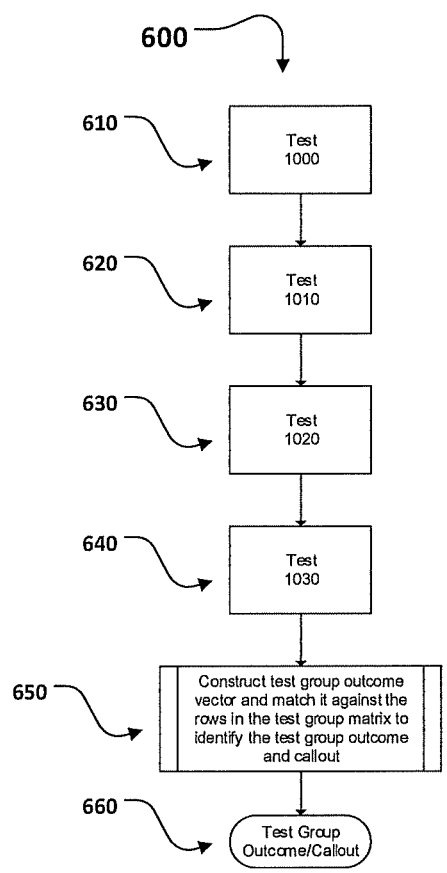
FIG. 6 is an exemplary depiction of a test failure isolation matrix using a truth-table representation

According to the invention, an associated truth table-based failure isolation matrix, as shown in FIG. 6 of the illustrated embodiment 600, is applied for all measurement results within a test. Each measurement that is verified against limits and thus produces an outcome is represented by a column in the truth table matrix 610. Each row represents a test outcome vector, or a user-defined combination of measurement outcomes and the corresponding test outcome 620 and callout 630. After the test finishes executing only one of the test outcome vectors matches the actual set of measurements results and the thus the test outcome 620 and callout 630 are identified.

Figures 7, 8:
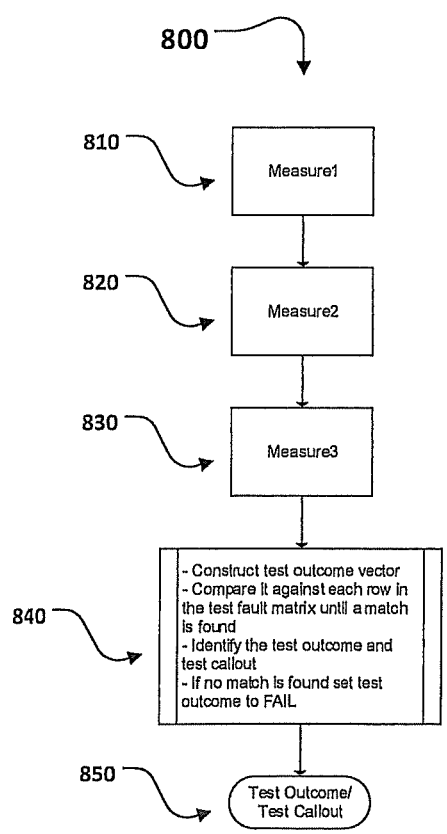
FIG. 7 illustrates the logic used by the Test Executive Engine when running parallel tests to isolate the PCOF using the test failure isolation matrix truth-table logic
FIG. 8 is a screen capture of the failure isolation matrix created for a single test that contains three signal measurements.

The invention is also applicable to parallel tests 700 as shown in FIG. 7. All measurements 710: Meas1, Meas2 and Meas3 are performed in parallel and the results, Pass or Fail are collected by the engine in a test outcome vector 720. At the end of the test the execution engine uses an algorithm 730 that compares run-time outcome vector against all the entries of the failure isolation matrix to find a match. When a match is found the test outcome and callout 740 are retrieved from the failure isolation matrix and used in the next steps of the test program execution. If no match of the run-time outcomes vector is found in the failure isolation matrix the test outcome is automatically set to "Failed" and this outcome is used in the next steps of the test program execution.

The execution of all tests regardless of the test outcome, and of all measurements inside each test regardless of the measurement outcome, and the usage of the truth table-based failure isolation matrices improves upon the existing limited fault isolation and fault detection mechanisms of traditional ATE test executives by allowing both the ability to find all faults within a UUT and the ability to isolate each determined fault down to the smallest ambiguity group for PCOF using additional diagnostic tests.

FIG. 8 shows a failure isolation matrix 800 created for an ATE analog test that contains three (3) signal measurements:

Meas1 is a DC Voltage measurement performed with a Digital Multi-Meter (DMM).

Meas2 is a Maximum Voltage measurement performed on an acquired waveform (the acquisition is captured with a Digital Oscilloscope).

Meas3 is a Frequency measurement performed on the same acquired waveform. The names of the measurements are specified by the user and they can be generic, as depicted in FIG. 8, or they can be more descriptive of the actual measurement being taken. An outcome vector is a unique combination of measurement outcomes and is represented as a row 810 in the failure isolation matrix. Measurements are compared with limits defined in the test as configured by the user. Depending on the type of measurement (analog, digital, serial), a specific type of comparison operation is used.

The supported comparison operations include: Compare an analog value, i.e. a double value with unit, or a double value against one or two limits. Compare an integer value against one or two limits. Compare a digital value against an expected value using a digital mask. Compare a serial data, or a string value against an expected value The possible values of a measurement outcome 820 as they can be defined in the failure isolation matrix include: Pass (P), indicating: the analog (double) or integer measured value is in a range of expected limits. The bus received data, or the digital read data (string) matches the expected value. Integer value matching the comparison criteria. A string value matching the expected value. A digital value having been applied on a specific mask matching the expected value. Fail High (H), indicating that the measured value exceeded the upper limit. For analog measurements (double values) only. Fall Low (L), indicating that the measured value was below the lower limit. For analog measurements (double values) only Fail (F), indicating either a Fail High or Fail Low condition for analog measurements (double values). Integer value not matching the comparison criteria, a bus received data or a digital read data not matching the expected value, a string value not matching the expected value, a digital value having been applied on a specific mask does not match the expected value. Timed Out (T), indicating that a timeout condition occurred while performing the measurement. No Measurement (N), indicating that an error occurred while performing the measurement. Don't Care (X), indicating that the value of the measurement does not matter when identifying a particular PCOF.

Each outcome vector 810 identifies a test outcome 840 and a callout result 850. An important consequence of the failure isolation matrix method is that each test may have any number of outcomes which allow the user to perform more detailed fault isolation. The callout represents the PCOF. The PCOF is configured by the user and contains a message that lists the possible faulty components and optionally an image of the UUT. The image allows the test developer to highlight where the faulty components exist upon the UUT, enabling a more rapid repair and replace process at the end of test execution.

Figure 9:
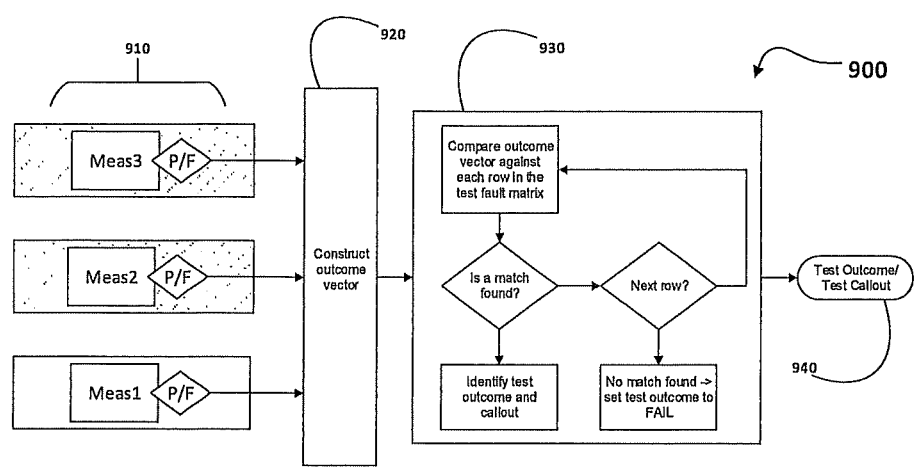
FIG. 9 represents a screen capture of the callout that gets displayed at the end of TPS execution that contains in addition to the identified PCOF an image of the board with the faulty component being highlighted.

Additionally, a distinct pattern or signature is encompassed within the resultant matrix 810. This distinct pattern can be used in a pattern matching process against previously obtained matrix patterns to further improve accuracy and narrow the scope of PCOF further enabling a more rapid repair and replace process at the end of test execution. Callouts similar to those depicted in FIG. 9 and FIG. 10 are displayed to the operator at the end of test program execution. FIG. 9 represents an exemplary callout that was generated from the failure of a test, and which contains both the PCOF 920 and the image 910 of the UUT where the faulty components are highlighted 930. Callout information gets propagated up the test program execution chain, from test to test group and in the end to the test program level. When multiple callouts exist, callouts can be grouped or displayed on a separate page where multiple pages are stacked together in the final test program outcome and callout dialog. For stacked callouts 1000, browsing through all callout pages is enabled by the navigation arrows 1020 provided in the callout dialog showing the individual PCOF 1010 and 1030 for each callout. FIG. 10 represents an example of a callout dialog having of a stack of callout information as it was identified at test level, test group level and test program level. If multiple tests and/or multiple test groups fail during one test program execution each test and/or test group callout will be displayed in the final callout dialog on a separate page. While with traditional Test Executives you can get one callout per test program execution, according to this invention a single test program execution can produce multiple callouts. Although a preferred embodiment of the invention has been disclosed for purposes of illustration, it should be understood that various changes, modifications and substitutions may be incorporated in the embodiment without departing from the spirit of the invention, which is defined by the claims which follow.

What is claimed is:

1. A default isolation matrix based system for an ATE, Automated Test Equipment, comprising:
   a test sequence comprising a plurality of individual ATE tests, defining a test group for a unit under test, wherein each test results in an outcome indication as the test sequence progresses;
   an outcome determination vector indicating a pass indication for the test group if all tests pass and a failure indication or if any one of the individual tests in the test group fails;
   wherein the individual test passes and test failures form a matrix pattern of sets of test results; and
   a test group callout or decision corresponding to the outcome vector or vectors indicating a user configured value representing a group of components in the unit under test associated with a particular set of test results in the matrix pattern.

2. The system of claim 1, wherein each set of test failures has a unique group of components associated therewith and identified in the matrix pattern.

3. The system of claim 1, wherein the system comprises a combination of fault detection, in which test groups are executed until all tests pass successfully or until a failure occurs and fault isolation, in which diagnostic specific test groups and tests are executed after a fault has been detected to narrow the ambiguity group of components that caused the failure.

4. The system of claim 1, wherein each individual test includes test measurements compared against an established limit or upper and lower limits.

5. The system of claim 1, wherein only one outcome vector of the matrix matches the actual test pass/failure test results.

6. The system of claim 1, wherein the test measurements are made in parallel.

7. The system of claim 1 wherein the test measurements are made serially.

8. The system of claim 1, wherein the measurements are analog, digital or serial.

9. The system of claim 1, wherein each callout or decision permits a more detailed fault isolation testing or diagnosis.

10. The system of claim 1, wherein the individual tests are performed by a digital multi-meter or a digital oscilloscope using waveform measurements.

11. The system of claim 1, including a display of the callout or decision containing the image of the faulty component of the unit under test.

12. The system of claim 1, wherein callout decisions can be grouped from different ATE tests.

13. The system of claim 1, wherein execution of a single test sequence can result in a plurality of callouts.

14. A default isolation matrix based test method using an ATE, Automated Test Equipment, comprising the steps of:
   carrying out a test sequence comprising a plurality of individual ATE tests, defining a test group for a unit under test, wherein each test results in an outcome indication as the test sequence progresses;

producing an outcome determination vector indicating a pass indication for the test group if all tests pass and a failure indication or if any one of the individual tests in the test group fails; wherein the individual test passes and failures form a matrix pattern of sets of test results; and producing a test group callout or decision corresponding to the outcome vector indicating a user configured value representing a group of components in the unit under test associated with a particular set of test passes and failures in the matrix pattern.

15. The method of claim 14, wherein each set of test passes and failures has a unique group of components associated therewith and identified in the matrix pattern.

16. The method of claim 14, wherein the system comprises a combination of fault detection, in which test groups are executed until all tests pass successfully or until a failure occurs and fault isolation, in which diagnostic specific test groups and tests are executed after a fault has been detected to narrow the ambiguity group of components that caused the failure.

17. The method of claim 14, wherein each individual test includes test measurements compared against an established limit or upper and lower limits.

18. The method of claim 14, wherein only one outcome vector of the matrix matches the actual test pass/failure test results.

19. The method of claim 14, wherein the test measurements are made in parallel.

20. The method of claim 14, wherein the test measurements are made serially.

21. The method of claim 14, wherein the measurements are analog, digital or serial.

22. The method of claim 14, wherein each callout or decision permits a more detailed fault isolation testing or diagnosis.

23. The method of claim 14, including the step of displaying the callout or decision containing the image of the faulty component of the unit under test.

24. The method of claim 14, including the step of grouping callout decisions from different ATE tests.

25. The method of claim 14, wherein the step of executing a single test sequence can result in a plurality of callouts.

* * * * *